United States Patent
Kagamihara

(10) Patent No.: US 6,303,487 B1
(45) Date of Patent: Oct. 16, 2001

(54) METHOD FOR FORMING AN AIR GAP IN AN INSULATING FILM BETWEEN ADJACENT INTERCONNECTION CONDUCTORS IN A SEMICONDUCTOR DEVICE

(75) Inventor: Masaki Kagamihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/454,122

(22) Filed: Dec. 3, 1999

(30) Foreign Application Priority Data

Dec. 3, 1998 (JP) .................................................. 10-344180

(51) Int. Cl.[7] ................................................ H01L 21/4763
(52) U.S. Cl. ............................ 438/619; 438/355; 438/359
(58) Field of Search .................................... 438/619, 355, 438/359

(56) References Cited

U.S. PATENT DOCUMENTS

| 5,728,631 | * | 3/1998 | Wang .................................. | 438/787 |
| 5,893,750 | * | 4/1999 | Hause et al. ........................ | 438/633 |
| 6,117,345 | * | 9/2000 | Liu et al. .............................. | 216/19 |

FOREIGN PATENT DOCUMENTS

| 57-190331 | 11/1982 | (JP) | ................................ | H01L/21/88 |
| 9-55431 | 2/1997 | (JP) | ............................. | H01L/21/768 |
| 9-64172 | 3/1997 | (JP) | ............................. | H01L/21/768 |
| 9-167766 | 6/1997 | (JP) | ............................. | H01L/21/316 |
| 10-150103 | 6/1998 | (JP) | ............................. | H01L/21/768 |
| 10-229121 | 8/1998 | (JP) | ............................. | H01L/21/768 |

* cited by examiner

Primary Examiner—Jey Tsai
Assistant Examiner—Lynne A. Gurley
(74) Attorney, Agent, or Firm—Hayes, Soloway, Hennessey, Grossman & Hage PC

(57) ABSTRACT

In a method for forming an air gap in an insulating film between adjacent interconnection conductors in a semiconductor device, a substrate having a first insulator film and a plurality of lower level interconnection conductors formed separately from each other on the first insulator film is set in a chemical vapor process machine. A second insulator film is deposited to completely cover the plurality of lower level interconnection conductors and the first insulator film in a chemical vapor process under the condition that a growth speed in a vertical direction perpendicular to a principal surface of the substrate is lower than a growth speed in a horizontal direction in parallel to the principal surface of the substrate, until the second insulator film has such a thickness that an air gap is formed within the second insulator film between the adjacent interconnection conductors. The deposition of the second insulator film is further continued under the condition that the growth speed in the vertical direction perpendicular to the principal surface of the substrate is not lower than the growth speed in the horizontal direction in parallel to the principal surface of the substrate, until the second insulator film reaches a necessary thickness.

6 Claims, 3 Drawing Sheets

METHOD FOR FORMING AN AIR GAP IN AN INSULATING FILM BETWEEN ADJACENT INTERCONNECTION CONDUCTORS IN A SEMICONDUCTOR DEVICE

BACKGROUND OF THE INVENTION

The present invention relates to a method for forming an air gap in an insulating film between adjacent interconnection conductors in a semiconductor device, in order to reduce a capacitance between the adjacent interconnection conductors.

In a semiconductor device, when a plurality of interconnection conductors are formed adjacent to each other at the same level in an insulating film, it is known to form an air gap between the adjacent interconnection conductors in order to reduce a capacitance between the adjacent interconnection conductors. This technology is disclosed by, for example, Japanese Patent Application Pre-examination Publication No.

JP-A-57-190331 (an English abstract of JP-A-57-190331 is available from the Japanese Patent Office and the content of the English abstract of JP-A-57-190331 is incorporated by reference in its entirety into this application), Japanese Patent Application Pre-examination Publication No. JP-A-09-055431 (an English abstract of JP-A-09-055431 is available from the Japanese Patent Office and the content of the English abstract of JP-A-09-055431 is incorporated by reference in its entirety into this application), Japanese Patent Application Pre-examination Publication No. JP-A-10-150103 (which corresponds to U.S. patent application Ser. No. 08/975,046 filed Nov. 20, 1997, the content of which is incorporated by reference in its entirety into this application, and an English abstract of JP-A-10-150103 is available from the Japanese Patent Office and the content of the English abstract of JP-A-10-150103 is incorporated by reference in its entirety into this application), and Japanese Patent Application Pre-examination Publication No. JP-A-10-229121 (an English abstract of JP-A-10-229121 is available from the Japanese Patent Office and the content of the English abstract of JP-A-10-229121 is incorporated by reference in its entirety into this application).

With an increased integration density of the semiconductor device, a spacing between adjacent interconnection conductors is decreasing more and more. When the spacing between adjacent interconnection conductors becomes small, however, the prior art process cannot satisfactorily or surely form between adjacent interconnection conductors an air gap which is effective in reducing the capacitance between the adjacent interconnection conductors.

BRIEF SUMMARY OF THE INVENTION

Accordingly, it is an object of the present invention to provide a method for forming an air gap in an insulating film between adjacent interconnection conductors in a semiconductor device, which has overcome the above mentioned problem of the prior art process.

Another object of the present invention is to provide a method for forming between adjacent interconnection conductors an air gap which is effective in reducing the capacitance between the adjacent interconnection conductors, even if the spacing between adjacent interconnection conductors becomes small.

Still another object of the present invention is to provide a method for forming an air gap in an insulating film between adjacent interconnection conductors in a semiconductor device, in a simple and certain process in comparison with the prior art process.

The above and other objects of the present invention are achieved in accordance with the present invention by a method for forming an air gap in an insulating film between adjacent interconnection conductors in a semiconductor device, comprising the steps of:

preparing a substrate having a first insulator film and a plurality of lower level interconnection conductors formed separately from each other on the first insulator film;

depositing a second insulator film to completely cover the plurality of lower level interconnection conductors and the first insulator film in a chemical vapor process under the condition that a growth speed in a vertical direction perpendicular to a principal surface of the substrate is lower than a growth speed in a horizontal direction in parallel to the principal surface of the substrate, until the second insulator film has such a thickness that an air gap is formed within the second insulator film between the adjacent interconnection conductors;

further continuing to deposit the second insulator film in the chemical vapor process under the condition that the growth speed in the vertical direction perpendicular to the principal surface of the substrate is not lower tan the growth speed in the horizontal direction in parallel to the principal surface of the substrate, until the second insulator film reaches a necessary thickness.

In one embodiment, the above mentioned two-step deposition of the second insulator film is carried out by:

setting the substrate on a lower electrode in a chemical vapor deposition machine;

depositing the second insulator film to completely cover the plurality of lower level interconnection conductors and the first insulator film in an atmosphere pressure chemical vapor deposition process while supplying a low bias voltage to the lower electrode and supplying a voltage supply voltage to an upper electrode located to oppose the substrate put on the lower electrode within the chemical vapor deposition machine, until the second insulator film has such a thickness that the air gap is formed within the second insulator film between the adjacent interconnection conductors; and further continuing to deposit the second insulator film in the atmosphere pressure chemical vapor deposition process by supplying an elevated bias voltage to the lower electrode until the second insulator film reaches the necessary thickness.

In another embodiment, the above mentioned two-step deposition of the second insulator film is carried out by:

setting the substrate in a bias electron cyclotron resonance chemical vapor deposition machine, depositing the second insulator film to completely cover the plurality of lower level interconnection conductors and the first insulator film in a bias electron cyclotron resonance chemical vapor deposition process while supplying a small RF power, until the second insulator film has such a thickness that the air gap is formed within the second insulator film between the adjacent interconnection conductors; and further continuing to deposit the second insulator film in the bias electron cyclotron resonance chemical vapor deposition process by supplying an RE power larger than the small RF power, until the second insulator film reaches the necessary thickness.

According to another aspect of the present invention, there is provided a method for forming an air gap in an insulating film between adjacent interconnection conductors in a semiconductor device, comprising the steps of:

preparing a substrate having a first insulator film and a plurality of lower level interconnection conductors formed separately from each other on the first insulator film, and setting the substrate on a lower electrode in a chemical vapor deposition machine;

depositing a second insulator film to completely cover the plurality of lower level interconnection conductors and the first insulator film in an atmosphere pressure chemical vapor deposition process while supplying a low bias voltage to the lower electrode and supplying a voltage supply voltage to an upper electrode located to oppose the substrate put on the lower electrode within the chemical vapor deposition machine so that a growth speed in a vertical direction perpendicular to a principal surface of the substrate is lower than a growth speed in a horizontal direction in parallel to the principal surface of the substrate, until the second insulator film has such a thickness that an air gap is formed within the second insulator film between the adjacent interconnection conductors;

further continuing to deposit the second insulator film in the atmosphere pressure chemical vapor deposition process until the second insulator film reaches a necessary thickness.

The above and other objects, features and advantages of the present invention will be apparent from the following description of preferred embodiments of the invention with reference to the accompanying drawings.

DETAILED DESCRIPTION OF THE INVENTION

Embodiment 1

Figure 1:
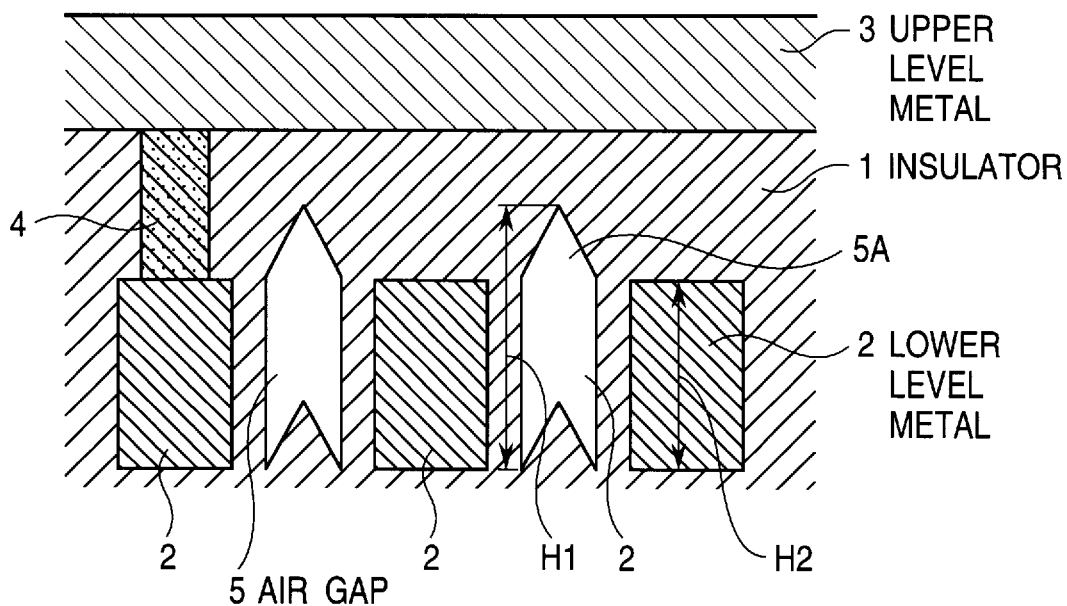
FIG. 1 is a diagrammatic sectional view of a semiconductor device having an air gap in an insulating film between adjacent interconnection conductors, formed by a first embodiment of the method in accordance with the present invention for forming the air gap in the insulating film between the adjacent interconnection conductors.

Referring to FIG. 1, there is shown a diagrammatic sectional view of a semiconductor device having an air gap in an insulating film between adjacent interconnection metals, formed by a first embodiment of the method in accordance with the present invention for forming the air gap in the insulating film between the adjacent interconnection metals.

The shown semiconductor device includes a multi-layered interconnection structure Within a lower level insulating film 1 which is formed on or above a substrate (not shown in FIG. 1), a plurality of lower level interconnection metals 2 are formed adjacent to each other but separately from each other. On the lower level insulating film 1, an upper level interconnection metal 3 is formed, which is electrically connected to one of the lower level interconnection metals 2 through a through hole 4 which is formed to reach the one lower level interconnection metal 2 and which is filled with a conductive material.

Furthermore, an air gap 5 is formed in the lower level insulating film 1 between each pair of adjacent lower level interconnection metals 2 in order to reduce a capacitance between the adjacent lower level interconnection metals 2. Therefore, this air gap 5 is completely surrounded by the lower level insulating film 1.

In addition, the air gap 5 has a height H1 which is larger than a height H2 of the adjacent lower level interconnection metals 2 (H1>H2).

Therefore, in the semiconductor device shown in FIG. 1, since the air gap 5 is formed in the lower level insulating film 1 between each pair of adjacent lower level interconnection metals 2, the capacitance between the adjacent lower level interconnection metals 2 is reduced.

Furthermore, since the air gap 5 formed in the lower level insulating film 1 between each pair of adjacent lower level interconnection metals 2 has the height H1 larger than the height H2 of the adjacent lower level interconnection metals 2 (H1>H2), a fringe capacitance parasitizing between a top surface of one of each pair of adjacent lower level interconnection metals 2 and a top surface of the other of each pair of adjacent lower level interconnection metals 2 is remarkably reduced by an upper end portion 5a of the air gap 5 which is higher than the top surface of the interconnection metals 2.

Now, the first embodiment of the method in accordance with the present invention for forming the air gap in the insulating film between the adjacent interconnection metals will be described with reference to FIGS. 2A to 2C.

Figure 2A:
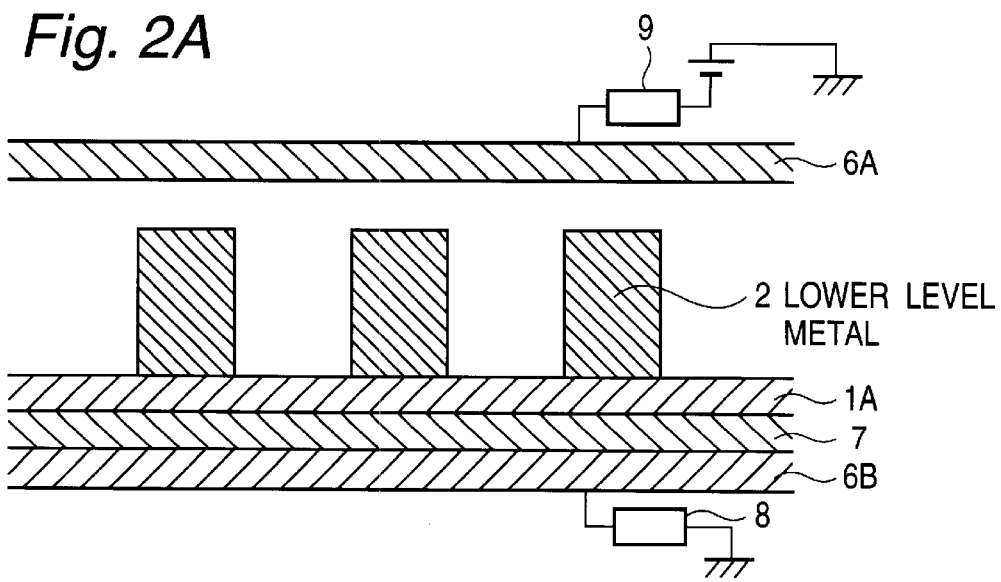
FIGS. 2A to 2C are diagrammatic sectional views of a semiconductor device, for illustrating the first embodiment of the method in accordance with the present invention for forming the air gap in the insulating film between the adjacent interconnection conductors.

As shown in FIG. 2A, after a first metal layer having a thickness of 0.8 $\mu$m is formed on a first insulator film 1A which is formed of for example a silicon oxide, on a semiconductor substrate 7, the first metal layer is patterned by use of a dry etching using a pattern photoresist mask (not shown), to form a plurality of lower level interconnection metals 2 separately from one another. For example, the lower level interconnection metals 2 have a minimum width of 0.68 $\mu$m and a minimum spacing of 0.52 $\mu$m. In FIG. 2A, the substrate 7 is depicted to have a thickness remarkably smaller than that of the lower level interconnection metals 2, for convenience of preparation of the drawing, differently from an actual situation.

Thereafter, a second insulator film 1B formed of for example a silicon oxide, is deposited on the whole surface to completely cover the lower level interconnection metals 2 and to have an upper surface sufficiently higher than a top surface of the lower level interconnection metals 2, by means of a film deposition process under the condition that a growth speed in a vertical direction perpendicular to a principal surface of the substrate is lower than a growth speed in a horizontal direction in parallel to the principal surface of the substrate. In this deposition process, an air gap 5 is formed in the deposited second insulator film 1B between each pair of lower level interconnection metals 2, as shown in FIG. 2B. In FIGS. 2B and 2C, the substrate 7 is omitted for simplification of the drawing.

Figure 2B:
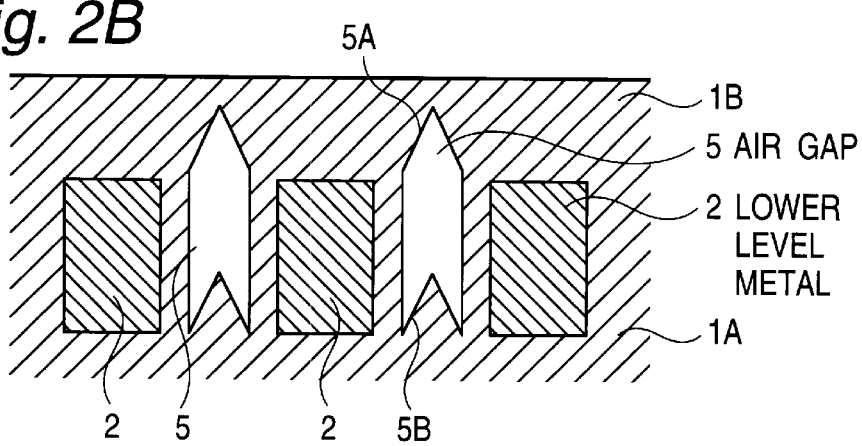
Figure 2C:
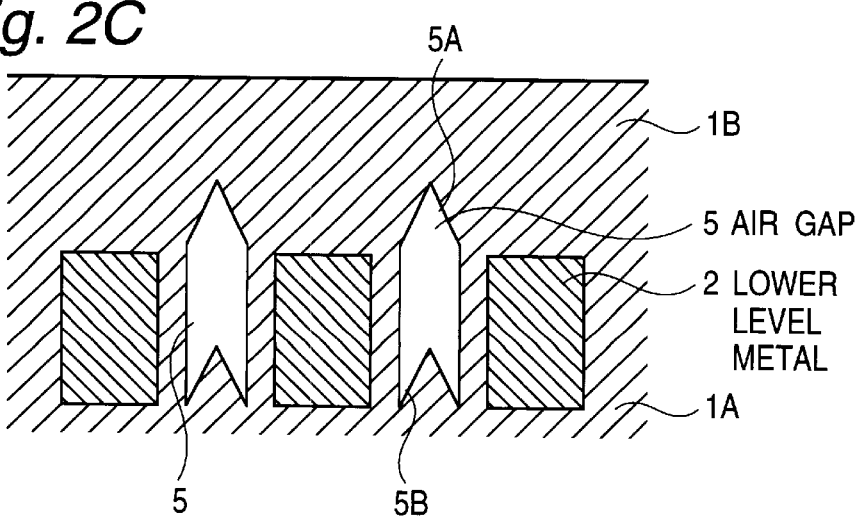

Thereafter, the second insulator film 1B is continuously further deposited to have a necessary film thickness, as shown in FIG. 2C, by means of the same film deposition process but under a different condition that the growth speed in the vertical direction perpendicular to the principal surface of the substrate is not lower than a growth speed in the horizontal direction in parallel to the principal surface of the substrate. Thus, the lower level insulating film 1 is formed of the first insulator film 1A and the second insulator film 1B deposited thereon.

Then, the through hole 4 is formed in the lower level insulating film 1 to reach one of the lower level interconnection metals 2, and filled with the conductive material. Further, the upper level interconnection metal 3 is formed on the lower level insulating film 1, as shown in FIG. 1.

First Example of Embodiment 1

For example, in order to make the growth speed in the vertical direction lower than the growth speed in the horizontal direction, as shown in FIG. 2A, the substrate 7 having the first insulator film 1A and the lower level interconnection metals 2 formed on the first insulator film 1A is set on a lower electrode 6B in an atmosphere pressure CVD machine, and a positive bias voltage is applied to the lower electrode 6B by means of a bias voltage supply 8. On the other hand, an upper electrode 6A opposing the substrate 7 put on the lower electrode 6B is applied with a negative voltage by a voltage supply 9.

In the atmosphere pressure CVD machine set as mentioned above, a second insulator film 1B of for example a silicon oxide, is deposited by supplying a low positive bias voltage to the lower electrode 6B from the bias voltage supply 8 until the second insulator film 1B has such a thickness that the air gaps 5 are formed within the second insulator film 1B, as shown in FIG. 2B.

Thereafter, the positive bias voltage supplied from the bias voltage supply 8 to the lower electrode 6B is elevated, and the second insulator film 1B is continuously further deposited to have the necessary film thickness, as shown in FIG. 2C. Thus, the lower level insulating film 1 is formed of the first insulator film 1A and the second insulator film 1B deposited thereon.

Then, the through hole 4 is formed in the lower level insulating film 1 to reach one of the lower level interconnection metals 2, and filled with the conductive material. Further, the upper level interconnection metal 3 is formed on the lower level insulating film 1, as shown in FIG. 1.

The air gaps 5 formed in the lower level insulating film 1 as mentioned above, has an uppermost point 5A which is higher than the top surface of the lower level interconnection metals 2 by about 0.35 $\mu$m, and a maximum width of about 0.35 $\mu$m.

In the above mentioned deposition process of the second insulator film 1B, until the second insulator film 1B has the necessary film thickness, the second insulator film 1B can be deposited while maintaining the low bias voltage supplied to the lower electrode 6B from the bias voltage supply 8.

In the above mentioned example, it would be apparent to persons skilled in the art that the height of the uppermost point 5A above the top surface of the lower level interconnection metals 2 is in no way limited to 0.35 $\mu$m, and the maximum width of the air gaps 5 is in no way limited to 0.35 $\mu$m. In addition, the lower level insulating film 1 may be formed of a silicon oxide containing another insulating material such as fluoride.

In the above mentioned embodiment, the air gaps 5 having an excellent dimension precision can be formed by controlling the bias voltage applied to the lower electrode 6B in the CVD machine when the second insulator film 1B of the lower level insulating film 1 is deposited to have the air gaps 5 in the CVD machine.

Second Example of Embodiment 1

In the first example mentioned above of the Embodiment 1, the insulating film having the air gap between the adjacent interconnection conductors, is formed in the atmosphere pressure CVD process, but can be formed by a bias ECR (electron cyclotron resonance) CVD process. Now, this process will be described with reference to FIGS. 2A to 2C.

The substrate 7 having the first insulator film 1A and a plurality of lower level interconnection metals 2 formed separately from each other on the first insulator film 1A as shown in FIG. 2A, is set in a bias ECR-CVD machine.

The second insulator film 1B formed of a silicon oxide, is deposited in the bias ECR-CVD process by supplying a RF power of 1.1 kW until the second insulator film 1B has such a thickness (for example, 0.6 $\mu$m) that the air gaps 5 are formed within the second insulator film 1B, as shown in FIG. 2B.

Thereafter, the second insulator film 1B is continuously further deposited in the same bias ECR-CVD process by supplying a RF power of 2.25 kW until the second insulator film 1B reaches the necessary film thickness, as shown in FIG. 2C. For example, the thickness of the additional deposition is 2 $\mu$m. Thus, the lower level insulating film 1 is formed of the first insulator film 1A and the second insulator film 1B deposited thereon.

After this, a process similar to that in the first Example of Embodiment 1 is carried out.

Embodiment 2

Figure 3:
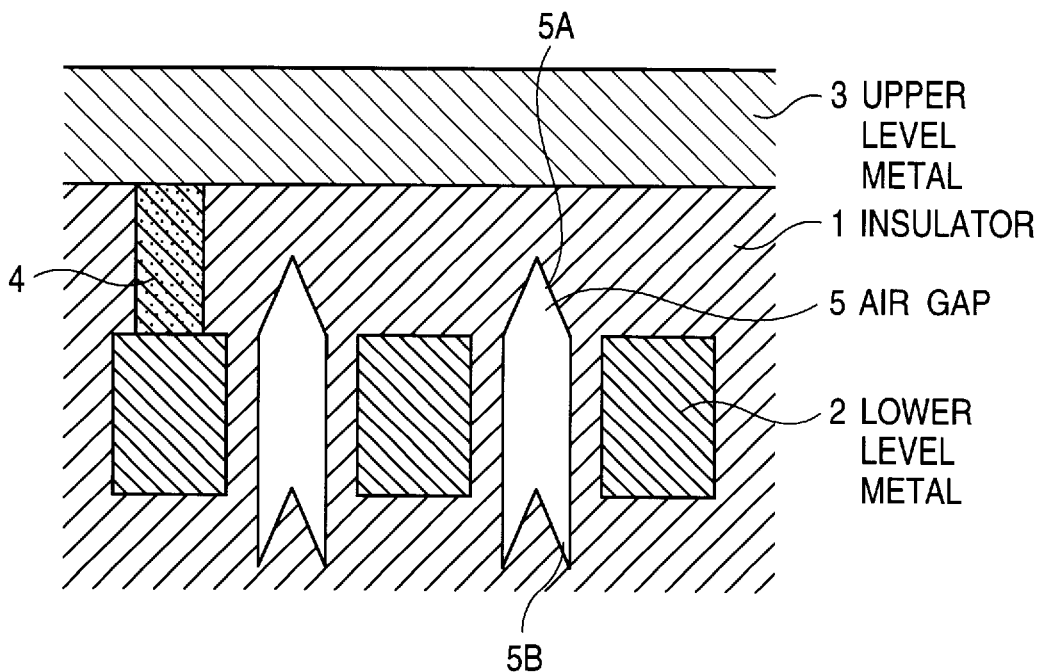
FIG. 3 is a diagrammatic sectional view of a semiconductor device having an air gap in an insulating film between adjacent interconnection conductors, formed by a second embodiment of the method in accordance with the present invention for forming the air gap in the insulating film between the adjacent interconnection conductors.

Referring to FIG. 3, there is shown a diagrammatic sectional view of a semiconductor device having an air gap in an insulating film between adjacent interconnection conductors, formed by a second embodiment of the method in accordance with the present invention for forming the air gap in the insulating film between the adjacent interconnection conductors. In FIG. 3, elements corresponding to those shown in FIG. 1 are given the same reference numbers, and explanation thereof will be omitted.

In the first embodiment mentioned above, the air gaps 5 are formed to have the uppermost point 5A which is higher than the top surface of the lower level interconnection metals 2, but a lower point which is at the same level as a bottom surface of the lower level interconnection metals 2. In this second embodiment, the air gaps 5 are formed to have not only the uppermost point 5A which is higher than the top surface of the lower level interconnection metals 2, but also a lowermost point 5B which is lower than the bottom surface of the lower level interconnection metals 2, as shown in FIG. 3.

Therefore, in the semiconductor device shown in FIG. 3, since the air gap 5 is formed in the lower level insulating film 1 between each pair of adjacent lower level interconnection metals 2, the capacitance between the adjacent lower level interconnection metals 2 is reduced.

Furthermore, since the air gap 5 formed in the lower level insulating film 1 between each pair of adjacent lower level interconnection metals 2 has the uppermost point 5A which is higher than the top surface of the lower level interconnection metals 2 and the lowermost point 5B which is lower than the bottom surface of the lower level interconnection metals 2, as shown in FIG. 3, a fringe capacitance parasitizing between the top surface of one of each pair of adjacent lower level interconnection metals 2 and the top surface of the other of each pair of adjacent lower level interconnection metals 2 and between the bottom surface of one of each pair of adjacent lower level interconnection metals 2 and the bottom surface of the other of each pair of adjacent lower level interconnection metals 2, is remarkably reduced by the upper portion 5a of the air gap 5 which is higher than the top surface of the interconnection metals 2 and the lower portion 5B which is lower than the bottom surface of the lower level interconnection metals 2.

First Example of Embodiment 2

Now, the second embodiment of the method in accordance with the present invention for forming the air gap in the insulating film between the adjacent interconnection metals will be described with reference to FIGS. 4A to 4C.

Figure 4A:
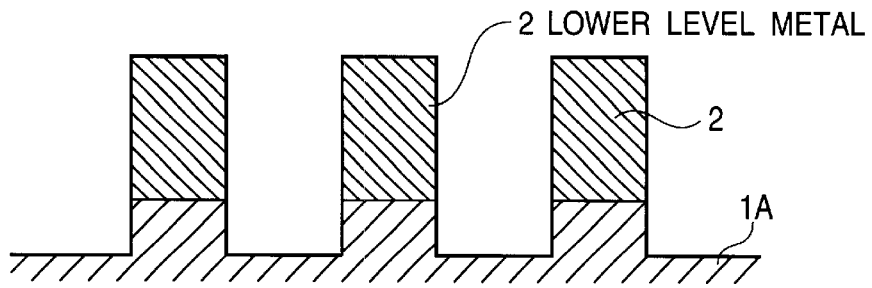
FIGS. 4A to 4C are diagrammatic sectional views of a semiconductor device, for illustrating the second embodiment of the method in accordance with the present invention for forming the air gap in the insulating film between the adjacent interconnection conductors.

As shown in FIG. 4A, after a first metal layer having a thickness of 0.8 µm is formed on a first insulator film 1A which is formed of for example a silicon oxide on a substrate (not shown), the first metal layer is patterned by use of a dry etching using a pattern photoresist mask, to form a plurality of lower level interconnection metals 2 separately from one another. For example, the lower level interconnection metals 2 have a minimum width of 0.68 µm and a minimum spacing of 0.52 µm. In FIGS. 4A to 4C, the substrate which should be under the first insulator film 1A, is omitted for simplification of the drawing.

When the first metal layer is patterned by use of the dry etching, the first insulator film 1A is over-etched in a region between the lower level interconnection metals 2, so that the first insulator film 1A is excavated to have a recess having a depth of about 0.31 µm from the bottom surface of the lower level interconnection metals 2.

Thereafter, a second insulator film 1B formed of for example a silicon oxide, is deposited on the whole surface to completely cover the lower level interconnection metals 2 and to have an upper surface sufficiently higher than a top surface of the lower level interconnection metals 2, by means of a film deposition process under the condition that a growth speed in a vertical direction perpendicular to a principal surface of the substrate is lower than a growth speed in a horizontal direction in parallel to the principal surface of the substrate, similarly to the step explained with reference to FIGS. 2A and 2B. In this deposition process, an air gap 5 is formed in the deposited second insulator film 1B between each pair of lower level interconnection metals 2, as shown in FIG. 4B.

Similarly to the step explained with reference to FIGS. 2A and 2B, a substrate (not shown in FIG. 4A) having the first insulator film 1A and the lower level interconnection metals 2 formed on the first insulator film 1A is set on the lower electrode 6B in an atmosphere pressure CVD machine, as shown in 2A, and a positive bias voltage is applied to the lower electrode 6B by means of a bias voltage supply 8. On the other hand, the upper electrode 6A opposing the substrate 7 put on the lower electrode 6B is applied with a negative voltage by the voltage supply 9, as shown in 2A.

Figure 4B:
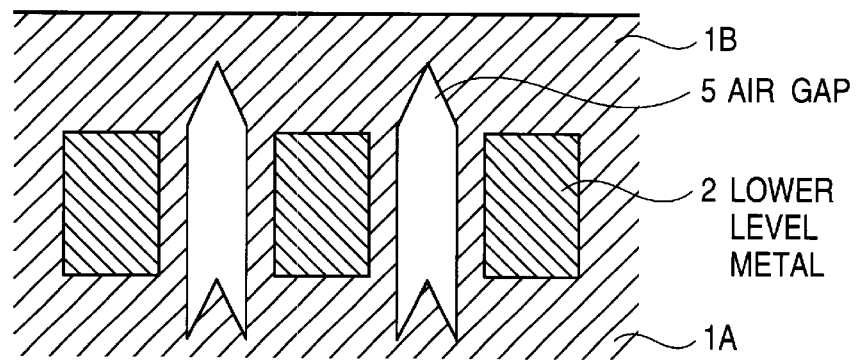

In the atmosphere pressure CVD machine set as mentioned above, a second insulator film 1B of for example a silicon oxide, is deposited by supplying the low positive bias voltage to the lower electrode 6B from the bias voltage supply 8 until the second insulator film 1B has such a thickness that the air gaps 5 are formed within the second insulator film 1B, as shown in FIG. 4B.

Figure 4C:
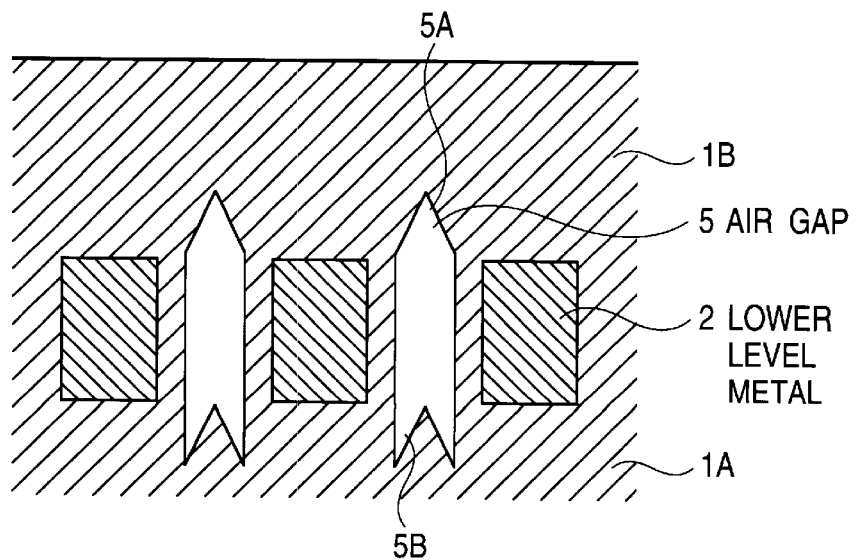

Thereafter, the positive bias voltage supplied from the bias voltage supply 8 to the lower electrode 6B is elevated, and the second insulator film 1B is continuously further deposited to have a necessary film thickness, as shown in FIG. 4C. Thus, the lower level insulating film 1 is formed of the first insulator film 1A and the second insulator film 1B deposited thereon.

Then, the through hole 4 is formed in the lower level insulating film 1 to reach one of the lower level interconnection metals 2, and filled with the conductive material.

Further, the upper level interconnection metal 3 is formed on the lower level insulating film 1, as shown in FIG. 3.

The air gaps 5 formed in the lower level insulating film 1 as mentioned above, has the uppermost point 5A which is higher than the top surface of the lower level interconnection metals 2 by about 0.35 µm, and the lowermost point 5B which is lower than the bottom surface of the lower level interconnection metals 2 by about 0.1 µm. The air gaps 5 has a maximum width of about 0.35 µm.

In the above mentioned deposition process of the second insulator film 1B, until the second insulator film 1B has the necessary film thickness, the second insulator film 1B can be deposited while maintaining the low bias voltage supplied to the lower electrode 6B from the bias voltage supply 8, similarly to the modification of the first embodiment.

In the above mentioned example of the second embodiment, it would be apparent to persons skilled in the art that the height of the uppermost point 5A above the top surface of the lower level interconnection metals 2 is in no way limited to 0.35 µm, and the position of the lowermost point 5B below the bottom surface of the lower level interconnection metals 2 is in no way limited to 0.1 µm. In addition, the maximum width of the air gaps 5 is in no way limited to 0.35 µm, and the lower level insulating film 1 may be formed of a silicon oxide containing another insulating material such as fluoride.

In the above mentioned example of the second embodiment, the air gaps 5 having an excellent dimension precision can be formed by controlling the bias voltage applied to the lower electrode 6B in the CVD machine when the second insulator film 1B of the lower level insulating film 1 is deposited to have the air gaps 5 in the CVD machine.

Second Example of Embodiment 2

In the first example mentioned above of the Embodiment 2, the insulating film having the air gap between the adjacent interconnection conductors, is formed in the atmosphere pressure CVD process, but can be formed by the bias ECR process, similarly to the second example of Embodiment 1. Now, this process will be described with reference to FIGS. 4A to 4C.

The substrate 7 having the first insulator film 1A and a plurality of lower level interconnection metals 2 formed separately from each other on the first insulator film 1A and also having a recess of a depth of about 0.3 µm formed in the first insulator film 1A, as shown in FIG. 4A, is set in a bias ECR-CVD machine.

The second insulator film 1B formed of a silicon oxide, is deposited in the bias ECR-CVD process by supplying a RF power of 1.1 kW until the second insulator film 1B has such a thickness (for example, 0.9 µm at the excavated portion of the first insulator film 1A) that the air gaps 5 are formed within the second insulator film 1B, as shown in FIG. 4B.

Thereafter, the second insulator film 1B is continuously further deposited in the same bias ECR-CVD process by supplying a RF power of 2.25 kW until the second insulator film 1B reaches the necessary film thickness, as shown in FIG. 4C. For example, the thickness of the additional deposition is 2 µm. Thus, the lower level insulating film 1 is formed of the first insulator film 1A and the second insulator film 1B deposited thereon.

After this, a process similar to that in the first Example of Embodiment 2 is carried out.

As mentioned above, according to the present invention, when the insulator film is deposited to have the air gaps in the CVD machine, the air gaps having an excellent dimension precision can be formed by controlling the film deposition condition (for example, the bias voltage applied to the lower electrode supporting the substrate in the atmosphere pressure CVD, and the RF power in the bias ECR-CVD). Therefore, the capacitance between the adjacent interconnection conductors can be effectively reduced even if the spacing between the adjacent interconnection conductors becomes small, and the fringe capacitance parasitizing the surface of the interconnection conductors can be also reduced. Accordingly, the overall capacitance parasitizing the interconnection conductors can be reduced.

The invention has thus been shown and described with reference to the specific embodiments. However, it should be noted that the present invention is in no way limited to the details of the illustrated structures but changes and modifications may be made within the scope of the appended claims.

What is claimed is:

1. A method for forming an air gap in an insulating film between adjacent interconnection conductors in a semiconductor device, comprising the step of:

preparing a substrate having a first insulator film and a plurality of lower level interconnection conductors formed separately from each other on said first insulator film;

depositing a second insulator film to completely cover said plurality of lower level interconnection conductors and said first insulator film in a chemical vapor process under the condition that a growth speed in a vertical direction perpendicular to a principal surface of said substrate is lower than a growth speed in a horizontal direction in parallel to said principal surface of said substrate, until said second insulator film has such a thickness that an air gap is formed within said second insulator film between said adjacent interconnection conductors, said air gap extending from level with a bottom surface of said interconnection conductors to above an upper surface thereof;

further continuing to deposit said second insulator film in said chemical vapor process under the condition that the growth speed in the vertical direction perpendicular to said principal surface of said substrate is not lower than the growth speed in the horizontal direction in parallel to said principal surface of said substrate, until said second insulator film reaches a thickness sufficient to cover said air gap and said interconnection conductors.

2. A method claimed in claim 1 wherein the above mentioned two-step deposition of said second insulator film is carried out by:

setting said substrate on a lower electrode in a chemical vapor deposition machine;

depositing said second insulator film to completely cover said plurality of lower level interconnection conductors and said first insulator film in an atmosphere pressure chemical vapor deposition process while supplying a low bias voltage to said lower electrode and supplying a voltage supply voltage to an upper electrode located to oppose said substrate put on said lower electrode within said chemical vapor deposition machine, until said second insulator film has such a thickness that said air gap is formed within said second insulator film between said adjacent interconnection conductors; and further continuing to deposit said second insulator film in said atmosphere pressure chemical vapor deposition process by supplying an elevated bias voltage to said lower electrode until said second insulator film reaches said thickness sufficient to cover.

3. A method claimed in claim 1 wherein the above mentioned two-step deposition of said second insulator film is carried out by:

setting said substrate in a bias electron cyclotron resonance chemical vapor deposition machine;

depositing said second insulator film to completely cover said plurality of lower level interconnection conductors and said first insulator film in a bias electron cyclotron resonance chemical vapor deposition process while supplying a small RF power, until said second insulator film has such a thickness that said air gap is formed within said second insulator film between said adjacent interconnection conductors; and further continuing to deposit said second insulator film in said bias electron cyclotron resonance chemical vapor deposition process by supplying an RE power larger than said small RF power, until said second insulator film reaches said thickness sufficient to cover.

4. A method for forming an air gap in an insulating film between adjacent interconnection conductors in a semiconductor device, comprising the step of:

preparing a substrate having a first insulator film and a plurality of lower level interconnection conductors formed separately from each other on said first insulator film, and setting said substrate on a lower electrode in a chemical vapor deposition machine;

depositing a second insulator film to completely cover said plurality of lower level interconnection conductors and said first insulator film in an atmosphere pressure chemical vapor deposition process while supplying a low bias voltage to said lower electrode and supplying a voltage supply voltage to an upper electrode located to oppose said substrate put on said lower electrode within said chemical vapor deposition machine so that a growth speed in a vertical direction perpendicular to a principal surface of said substrate is lower than a growth speed in a horizontal direction in parallel to said principal surface of said substrate, until said second insulator film has such a thickness that an air gap is formed within said second insulator film between said adjacent interconnection conductors, said air gap extending from a level below a bottom surface of said interconnection conductors to above an upper surface thereof;

further continuing to deposit said second insulator film in said atmosphere pressure chemical vapor deposition process until said second insulator film reaches a thickness sufficient to cover said air gap and said interconnection conductors.

5. A method claimed in claim 4 wherein said further deposition of said second insulator film is carried out by supplying an elevated bias voltage to said electrode so that the growth speed in the vertical direction perpendicular to said principal surface of said substrate is not lower than the growth speed in the horizontal direction in parallel to said principal surface of said substrate, until said second insulator film reaches said thickness sufficient to cover.

6. A method claimed in claim 4 wherein said further deposition of said second insulator film is carried out by maintaining said low bias voltage to said lower electrode until said second insulator film reaches said thickness sufficient to cover.

* * * * *